Jan. 13, 1959 B. B. BYCER 2,869,080

MODULATOR-OSCILLATOR CIRCUIT

Filed Sept. 28, 1955

INVENTOR.
BERNARD B. BYCER
BY
Edward M. Farrell
ATTORNEY

United States Patent Office
2,869,080
Patented Jan. 13, 1959

2,869,080

MODULATOR-OSCILLATOR CIRCUIT

Bernard B. Bycer, Philadelphia, Pa., assignor to Tele-Dynamics Inc., a corporation of Pennsylvania Application September 28, 1955, Serial No. 537,088
5 Claims. (Cl. 332—28)

Figure 1:
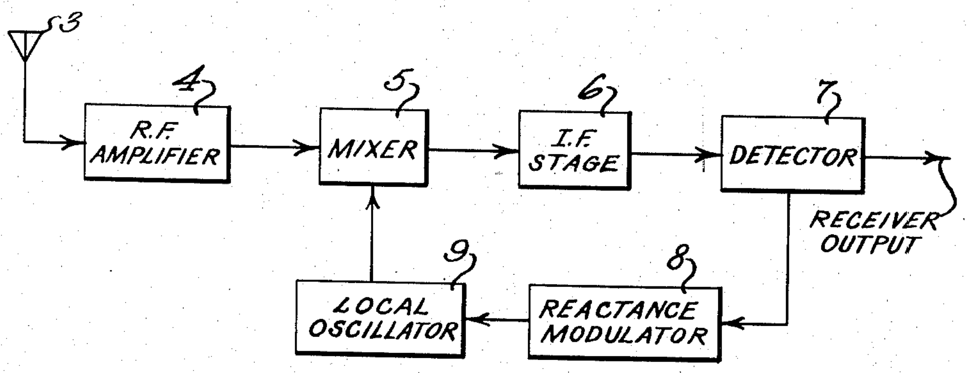

This invention relates to high frequency oscillators and, more particularly, to reactance modulators associated with such oscillators.

When a high frequency oscillator is frequency or phase modulated through the use of an associated reactance tube, the frequency of oscillation is dependent to a great extent upon the voltages supplied to such a tube. A modulation signal voltage is applied to one of the elements of the reactance tube to attain phase or frequency modulation of the oscillator.

In many high frequency systems, it is difficult to frequency or phase modulate a high frequency oscillator operating at its fundamental frequency over a wide range. For this reason, the oscillator is often designed to operate at a sub-harmonic frequency of the desired frequency of operation. Frequency multiplier stages are then employed to increase the frequency of the oscillator to the desired frequency of operation. Frequency multiplication also increases the amount of phase or frequency modulation of the oscillator.

An increase in the amount of phase or frequency modulation may also be attained through the application of higher modulating signal voltages to a reactance modulator tube. However, application of such high signal voltages often creates attendant design problems. For example, since such tubes generally operate with relatively low bias potential, application of too high a voltage to a reactance modulator tube may cause faulty operation by driving the tube to cut off or to saturation.

In the design and manufacture of high frequency systems, it is often convenient to use triode vacuum tubes. Heretofore, the use of such triode tubes as reactance modulators has proven unsatisfactory in some respects. For example, the grid to plate capacity in triode tubes is large. The driving voltage which may be applied to the tube is therefore limited. Also, the plate resistance of such tubes varies over relatively wide ranges for modulating signals of different amplitudes.

In many typical triode tubes, the plate resistance near cut-off may be 120 K ohms. The plate resistance for the same typical tubes may be only 5 K ohms near zero bias. The plate resistance in such tubes therefore varies over a ratio from 24 to 1 in attempting to reactance sweep an associated oscillator over a range from cut-off to zero bias.

In receiving circuits, various types of oscillators may be employed. Double conversion superheterodyne receivers are often employed in telemetering systems where the transmitted frequency is in the band from 215 to 235 megacycles. In such receivers two local oscillators and two different intermediate frequencies are utilized. The first local oscillator is of a relatively high frequency and, heretofore, frequency doubling or tripling stages have been used to provide a sufficiently high frequency of operation.

Whenever the center frequency of an incoming signal drifts from the frequency to which a receiver is tuned, automatic frequency control of the oscillator is often used to compensate for such drifts. A reactance modulator provides automatic frequency control by injecting a varying reactance component into the tank circuit of the local oscillator. The automatic frequency control voltage, in such cases, is generally derived from the output circuit of the discriminator in F. M. systems.

In many cases, it is desirable to operate the modulator tubes at a relatively high negative potential, so that a heavy load is not connected across the oscillator tank circuit. Very often, if the low negative potential is exceeded, the reactance tubes offer a low resistance to the oscillator tank circuit thereby loading the tank circuit causing the oscillator to cease functioning.

It is known that most oscillator circuits develop a self-biasing potential during normal operation. In the absence of oscillation within the circuit, no biasing potential is developed. With no biasing potential, the current in the oscillator circuit is very high and, in many cases, causes an oscillator tube and other associated elements to burn out or otherwise become defective. Failure of a local oscillator in a telemetering receiver may result in the loss of vital information connected with guided missiles or other pilotless aircraft.

In telemetering systems, the received frequency may be between 215 and 235 megacycles. It may be desirable to vary the tuning from one frequency to another. In this case, the local oscillator must be capable of operating at different frequencies to provide a constant intermediate frequency. Varying the tuning of the oscillator, by manual variation or by the insertion of a different tuned circuit, affects the reactance modulator circuit to some extent. It is desirable that a voltage of the same level applied to a reactance modulator produce the same percentage of deviation in the oscillator frequency despite the changes in the oscillator frequency. Such an arrangement would eliminate the necessity of additional adjustment or compensation circuitry when the frequency of the oscillator is changed.

Constant frequency deviation is also desirable in many types of test equipment, such as oscilloscopes. When such constant frequency deviation is not attained, it is often necessary to adjust controls on the test equipment when different frequencies are measured. Such adjusting is not only inconvenient and time consuming but also may result in inaccurate readings unless care is exercised.

It is also desirable in many systems to provide a modulation circuit which may receive both D. C. and A. C. signals up to relatively high frequencies.

It is another object of this invention to provide an improved high frequency oscillator of high stability.

It is a further object of this invention to provide an improved high frequency oscillator which may be phase or frequency modulated over a relatively wide range without frequency multiplication.

It is still a further object of this invention to provide an oscillator with electron discharge devices wherein protective means for such devices are provided when oscillations fail.

It is still a further object of this invention to provide an improved reactance modulator wherein an applied voltage of a given amplitude will produce a constant percentage of frequency deviation in an oscillator operative at different frequencies.

It is still a further object of this invention to provide means for sustaining oscillation when associated modulators are driven beyond their normal ratings.

In accordance with the present invention, an oscillator provides a relatively low current during oscillations and a relatively high current with no oscillations. A reactance modulator circuit is utilized to vary the frequency of the oscillator. Means for applying a modulation signal to the reactance modulator are provided. A bias potential for the reactance modulator is provided by the current in the oscillator. When oscillations cease, due to overloading the oscillator tank circuit, the resulting bias "backs off" the reactance modulator to remove the effects of overloading. The reactance modulator circuit presents a split stator capacitor to the tank circuit of the oscillator to permit high frequency of operation. The reactance modulator circuit further permits constant percentage of deviation of an oscillator designed to oscillate at different frequencies.

Figure 2:
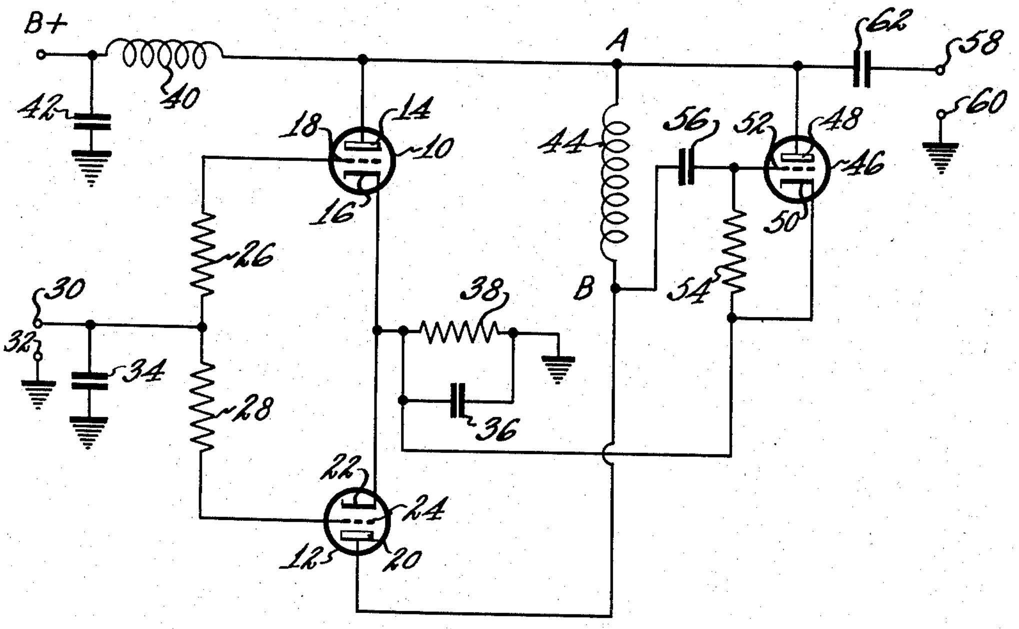

Other objects and advantages of the present invention will be apparent to those skilled in the art to which the invention pertains from a reading of the following specification in connection with the accompanying drawing, in which Figure 1 is a block diagram illustrating one system wherein the present invention may be included, and Figure 2 is a schematic circuit diagram illustrating one form of the present invention.

Referring particularly to Figure 1, an incoming electrical signal, which may comprise an F. M. signal carrying telemetered information, is received by a receiving antenna 3 and applied to an R. F. amplifier, designated by a block 4. The output signal voltage from the R. F. amplifier is applied to a mixer stage, represented by a block 5. An output signal voltage from a local oscillator, designated by a block 9, is also applied to the mixer stage 5. The signals from the R. F. amplifier 4 and the local oscillator 9 combine in the mixer stage 5 to produce an intermediate frequency signal in the output circuit of the mixer stage 5. The intermediate frequency signal from the mixer 5 is applied to an I. F. stage, designated by a block 6. The output from the I. F. stage 6 is applied to a form of detector, designated by a block 7, which, in F. M. receivers may be a form of discriminator circuit. The output voltage from the detector 7, which may be D. C., may be applied to subsequent stages within the receiver. A portion of the output voltage from the detector 7 is applied to a reactance modulator circuit, designated by a block 8. If the center frequency of the incoming signal at the antenna 3 drifts from the frequency to which the receiver is tuned, or if the local oscillator frequency shifts with the incoming signal remaining constant, automatic frequency control of the local oscillator 9 is attained by injecting a varying reactance component into the tank circuit of the oscillator. If the center frequency of the received signal does not drift, and the oscillator frequency does not shift, no output from the detector 7 is provided. Consequently, the frequency of the local oscillator is 9 is not varied.

The present invention is concerned chiefly with types of oscillators and reactance modulators and may, if desired, be employed in a system, such as shown in Figure 1. Such oscillators and modulators may also be used in the transmitting ends of various systems.

Referring particularly to Figure 2, a reactance modulator circuit includes a pair of triode tubes 10 and 12 connected in push-pull relationship. The triode tube 10 comprises an anode 14, a cathode 16 and control grid 18 while the triode tube 12 comprises an anode 20, a cathode 22 and a control grid 24.

Modulating signals may be applied through a single ended input to the control grids 18 and 24 through resistors 26 and 28 from a pair of input terminals 30 and 32. The frequency of modulation may be from D. C. and extend to the highest frequency normally used in F. M. systems. A signal bypass capacitor 34 is connected between the terminal 30 and a point of reference potential designated as ground. Self-biasing means including a capacitor 36 and a resistor 38 are connected between the cathodes 16, 22 and ground. The anode 14 is connected to a source of operating potential designated as B+ through a filter network comprising a coil 40 and a capacitor 42. The anode 20 is also connected to B+ through the coil 44 and the filter network comprising the coil 40 and the capacitor 42.

The oscillator portion of the circuit comprises a triode tube 46 having an anode 48, a cathode 50 and a control grid 52. A resistor 54 is connected between the cathode 50 and a control grid 52. The bottom of the coil 44, designated as a point B, is connected to B+. The output voltage from the oscillator is applied to a pair of output terminals 58 and 60 through a coupling capacitor 62. The output voltage from the oscillator may be taken from other points, such as point B, if desired. The cathode 50 is also connected to the cathodes 16 and 22, so that the space current flowing through the triode tube 46 also flows through the self-biasing resistor 38.

In considering the operation of the circuit shown, the oscillator is a modified Colpitts type. The tank circuit for the oscillator comprises the coil 44, which is above ground for radio frequency signals. Signals developed across the coil 44 are 180 degrees apart at points A and B. Consequently, at some point on the coil 44, between the points A and B, there exists a ground for radio frequency signals. Assuming such a ground, it may be seen that a feedback loop exists between the anode-cathode circuit of the triode tube 46. A second loop or inductive winding may also be said to exist in the grid-cathode circuit of the triode tube 46. The close coupling between the two loops permits feedback from the output to the input circuit of the triode tube 46. This feedback is sufficient to sustain oscillations.

The total of the capacities associated with the triode tubes 10, 12 and 46, as well as other capacities associated with the circuit shown, form a parallel resonant circuit with the coil 44. These capacities determine the frequency of operation of the oscillator as well as the amount of feedback from the output to the input circuit of the oscillator.

The reactance modulator portion of the circuit shown comprises the pair of triode tubes 10 and 12. The radio frequency feedback which convert these tubes from ordinary amplifiers into reactance tubes is fed from the anodes 14 and 20 to the control grids 18 and 24 of the tubes 10 and 12, respectively.

Considering first the reactance tube 10, the anode-to-grid interelectrode capacity and the resistor 26 form a phase shifter which feeds phase-shifted voltage from the anode 14 to the control grid 18. The resistor 26 is made relatively low compared to the reactance of the anode-to-grid interelectrode capacity so that the phase of the current through the phase shifter is determined primarily by the anode-to-grid capacity and, consequently, leads the voltage at the anode. The leading current through the anode-to-grid capacity causes a voltage drop across the resistor 26, which leads the current at the anode 14. When this leading voltage, which is applied to the control grid 18, is amplified by the triode tube 10, the anode circuit appears as a capacitive effect since the current flowing in the anode circuit is caused to lead a voltage applied to the control grid 18.

The operation of the triode tube 12 is substantially similar to the operation of the triode tube 10. The resistor 28 and the anode-to-grid capacity of the tube 12 form a phase shifter. The phase of the current through the phase shifter is determined primarily by the anode-to-grid and leads the anode voltage. The voltage drop across the resistor 28 leads the anode current. The leading voltage at the control grid is amplified by the triode tube 12. The anode circuit of the triode tube 12 appears as a capacitive effect since the anode current is caused to lead the voltage applied to the control grid 24.

It is seen that the anode circuits for the triode tubes 10 and 12 both appear across the coil 44 with the anodes being connected to opposite ends of the coil. These circuits may be considered as two capacitors across the coil 44, the values of the capacitors determining to a great extent the frequency of the oscillator associated with the coil 44. The use of two capacitors which, in effect, are connected in series across the coil 44 permits a higher frequency of operation of the oscillator than would be possible if a single capacitor, or single reactance tube circuit, were employed.

A single-ended input is employed in the present circuit with a modulating signal, which may be a D. C. voltage from a discriminator circuit, or A. C. from other sources, is applied simultaneously to the control grids 18 and 24 through the input terminals 30 and 32. It may be seen that a modulating signal if applied to the control grids 18 and 24 causes a corresponding change in the current in the triode tubes 10 and 12. The changes in current will cause effective changes in the capacities across the coil 44 to thereby change the oscillator frequency. If the oscillator and reactance modulator circuit shown is used in a system, such as illustrated in Figure 1, the oscillator frequency may be varied to compensate for drifts in the center frequency of a received signal or drifts in the local oscillator frequency.

The double capacitive effect created by the two triode tubes 10 and 12 not only permits a higher oscillator frequency but, in addition, creates substantially a double effective change in the frequency or phase shift of the oscillator. Consequently, the amount of modulating voltage applied to a modulator tube need not be excessive. Since many reactance modulator tubes are operated at relatively low bias potential, a pair of triode tubes to accomplish a high degree of modulation is desirable. The use of a pair of reactance tubes permitting a higher frequency of operation and a greater degree of phase or frequency modulation makes it possible to operate an oscillator at its fundamental frequency in high frequency systems. The necessity of subsequent stages of multiplication is thereby eliminated.

In many systems, such as in telemetering, it is often desirable to shift the frequency of the received signal. When this is done, the frequency of the oscillator must also be shifted so that a resulting mixed signal will be the intermediate frequency for which a receiver is designed. The change in the frequency of the oscillator may be achieved by inserting a new coil in the place of the coil 44 or by incorporating variable means, such as a movable slug in the coil 44, to attain continuously variable tuning.

When the frequency of the oscillator is varied, it is desirable that the percentage of deviation of the oscillator frequency caused by the same value of modulating signals be the same for different frequencies. If the percentage of frequency deviation of the oscillator frequency is different for different frequencies when the same amplitude of modulating signal is applied to the associated reactance tubes, means must be included in the circuit to compensate for these differences. In the present circuit, the total capacity associated with the oscillator tank circuit remains the same for all oscillator frequencies when the changes in the oscillator frequency is attained by insertion of a different coil or by varying the inductive reactance of the tuned circuit of the oscillator. Consequently, since the reactance tubes employed create a capacitive effect, a constant percentage of deviation is attainable through the use of the present invention when the frequency of oscillations is varied. Push-pull reactance modulators used heretofore have used one tube to produce a capacitive effect and the other tube to produce an inductive effect. The use of such push-pull modulators does not achieve a desired constant percentage of deviation of the oscillator frequency.

The constant frequency deviation feature of the present invention makes the present circuit highly useful in various types of test equipment, such as oscilloscopes.

Another important feature of the present invention is the means employed to protect the oscillator triode tube 46 in the event that oscillations cease.

During normal operation of the oscillator, a self-bias is developed across the resistor 54. The voltage, being applied across the grid-cathode circuit of the triode tube 46, limits the current in the oscillator tube. The current through the tube 46 also flows through the resistor 38, which is common to the anode-cathode circuits of the reactance modulator triodes 10 and 12.

During normal operation of the circuit shown, the D. C. voltage developed across the resistor 38 is relatively small since the value of the resistor is relatively low and may be in the order of less than 100 ohms. This permits the control grids 18 and 24 of the reactance modulator tubes 10 and 12 to operate with a relatively low negative bias, with respect to the cathodes 16 and 22, respectively. This bias may be in the order of .2 volt. Operation with a low bias permits a greater degree of modulation of the oscillator circuit. However, if the applied modulating signal becomes too great, a heavy load will be presented to the oscillator tank circuit including the coil 44 to cause the oscillator to cease functioning.

When oscillation ceases, no bias voltage is developed across the resistor 54 and the current in the triode 46 will be high and ordinarily destructive to the tube. The triode tubes 10 and 12 will also draw large currents when high positive modulating signals are applied thereto. The toal current through the triode tubes 10, 12 and 46 produces a large bias potential across the common resistor 38, making the control grids 18 and 24 more negative with respect to the cathodes 16 and 22. The developed bias voltage across the resistor 38 immediately reduces the current in the triode tubes 10 and 12 thereby removing the heavy load from the oscillator tank circuit. With the heavy load removed, the oscillator resumes normal operation and a negative bias potential is again developed across the resistor 54. Hence, it is seen that the voltage across the resistor 38 is negligible under normal operation and backs off the modulator tubes at or near zero bias potential to maintain proper loading across the oscillator tank circuit. The action just described occurs almost instantaneously so that oscillations are sustained at all times to provide a very stable oscillator.

It is thus seen that the circuit embodying the present invention has provided an improved oscillator-modulator circuit. The oscillator is capable of high frequency operation and may be phase or frequency modulated over a relatively wide range, thereby eliminating the necessity of subsequent stages of multiplication. Effective means are provided to prevent the destruction of the oscillator tube in the absence of oscillations, as may result when the modulator is overloaded or when other conditions prevent the oscillator from operating.

Tubes other than triodes may be employed if desired. The invention may also be practiced utilizing only a single reactance modulator tube. However, the high percentage of modulation will not be as great with a single tube, although the protective feature for the oscillator tube may still be included in such a modification. Other forms of oscillators, other than the one shown, may also be employed.

What is claimed is:

1. In a frequency modulation system, an oscillator electron discharge device associated with a tuned circuit including an inductive element, a phase shifting means including a pair of reactance modulator tubes, each of said tubes having an anode, a cathode and a control grid, means coupling said anodes to opposite ends of said inductive element, each of said tubes providing a capacitive effect across said tuned circuit, means for producing a bias potential inversely proportional to the current in said oscillator electron discharge device, means for applying said bias potential to said modulator tubes to bias said control grids negative with respect to said cathodes, and means for applying modulating signal to said control grids.

2. In a frequency modulation system, an oscillator electron discharge device associated with a tuned circuit including an inductive element, phase shifting means including a pair of reactance modulator tubes, each of said tubes having an anode, a cathode and a control grid, means coupling said anodes to opposite ends of said inductive element, each of said tubes providing a capacitive effect across said tuned circuit, means for applying a modulating signal to said control grids, means for producing a bias potential inversely proportional to the current in said oscillator electron discharge device, and means for applying said bias potential to said modulator tubes to bias said control grids negative with respect to said cathodes.

3. An oscillator circuit providing a relatively low current during oscillations and a relatively high current with no oscillations, said oscillator circuit including a tuned circuit having an inductive element, means for varying the frequency of oscillation of said oscillator circuit including a pair of reactance modulator tubes, each of said tubes having an anode, a cathode and a control grid, means for coupling said anodes to opposite end of said inductive element, said tubes each providing a capacitive effect across the tuned circuit of said oscillator circuit, means for applying a modulation signal to said modulator tubes, means for producing a bias potential inversely proportional to the current in said oscillator electron discharge device, and means for applying said bias potential to said modulator tubes to bias said control grids negative with respect to said cathodes.

4. A modulator-oscillator circuit comprising an oscillator having a tuned circuit including an inductive element, means for biasing said oscillator during normal operation whereby the current in said oscillator is relatively low during normal operation and relatively high in the absence of oscillations, a pair of reactance modulator tubes connected across said tuned circuit and providing a capacitive effect, said reactance modulator tubes each including an anode, a cathode, and a control grid, means for coupling said anodes to opposite ends of said inductive element of said tuned circuit, a common self-biasing means connected between said cathodes of said reactance modulator tubes and a point of reference potential, means for including said self-biasing means in said oscillator circuit whereby the current in said oscillator flows therethrough a single ended input circuit connected to said control grids of said reactance modulator tubes, and means for applying a modulating signal to said single-ended input circuit whereby the capacitive effect provided by said reactance modulator tubes varies in accordance with said modulating signal to vary the frequency of said oscillator.

5. A modulator-oscillator circuit comprising an oscillator circuit having a tuned circuit including an inductive element, said oscillator circuit further including a triode tube having an anode, cathode and control grid, a resistor connected between said cathode and control grid to provide a bias for said oscillator during normal operation, the current in said oscillator circuit being relatively low during oscillations and relatively high in the absence of oscillations, a pair of reactance modulator triode tubes connected across said tuned circuit to provide a capacitive effect, said reactance modulator triode tubes each including an anode, a cathode and a control grid, means for coupling said anodes to opposite ends of said inductive element of said tuned circuit, a self-biasing resistor connected between said cathodes of said reactance modulator triode tubes and a point of reference potential, means for connecting the cathode of said triode tube included in said oscillator circuit to the cathodes of said reactance modulator triode tubes whereby the current in said oscillator circuit flows through said resistor, a single ended input circuit connected to said control grids of said reactance modulator tubes, and means for applying a modulating signal to said single-ended input circuit whereby the capacitive effect provided by said reactance modulator triode tubes varies in accordance with said modulating signal to vary the frequency of said oscillator circuit.

References Cited in the file of this patent

UNITED STATES PATENTS

| | | |
|---|---|---|
| 2,282,103 | Tunick | May 5, 1942 |
| 2,427,231 | Sear | Sept. 9, 1947 |